(12) United States Patent
Nishiwaki et al.

(10) Patent No.: US 7,255,972 B2
(45) Date of Patent: Aug. 14, 2007

(54) CHEMICALLY AMPLIFIED POSITIVE PHOTOSENSITIVE RESIN COMPOSITION

(75) Inventors: Yoshinori Nishiwaki, Shizuoka (JP); Toshimichi Makii, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/532,364

(22) PCT Filed: Oct. 16, 2003

(86) PCT No.: PCT/JP03/13233

§ 371 (c)(1),
(2), (4) Date: Apr. 20, 2005

(87) PCT Pub. No.: WO2004/038506

PCT Pub. Date: May 6, 2004

(65) Prior Publication Data

US 2005/0271972 A1     Dec. 8, 2005

(30) Foreign Application Priority Data

Oct. 23, 2002    (JP)    ............................ 2002-308089

(51) Int. Cl.
G03F 7/039 (2006.01)
G03F 7/40 (2006.01)
(52) U.S. Cl. .................. 430/270.1; 430/910; 430/905; 430/192; 430/176; 430/315; 430/314; 430/313; 430/324
(58) Field of Classification Search ............... None
See application file for complete search history.

(56) References Cited

U.S. PATENT DOCUMENTS

| | | | |
|---|---|---|---|
| 3,666,473 A | | 5/1972 | Colom et al. |
| 4,115,128 A | | 9/1978 | Kita |
| 4,247,611 A | | 1/1981 | Sander et al. |
| 4,275,139 A | | 6/1981 | Stahlhofen |
| 4,311,782 A | * | 1/1982 | Buhr et al. ............... 430/270.1 |
| 4,506,003 A | | 3/1985 | Ruckert et al. |
| 4,506,006 A | | 3/1985 | Ruckert |
| 4,678,737 A | | 7/1987 | Schneller et al. |
| 4,737,426 A | * | 4/1988 | Roth ............................ 430/17 |
| 4,789,619 A | * | 12/1988 | Ruckert et al. ........... 430/270.1 |
| 5,858,518 A | * | 1/1999 | Omote et al. ............... 428/209 |
| 6,635,400 B2 | | 10/2003 | Kato et al. |
| 6,720,128 B2 | | 4/2004 | Adegawa et al. |
| 2001/0040066 A1 | | 11/2001 | Kato et al. |
| 2003/0039916 A1 | | 2/2003 | Adegawa et al. |

FOREIGN PATENT DOCUMENTS

| | | |
|---|---|---|
| EP | 0 520 624 A1 | 12/1992 |
| GB | 2 172 117 A | 9/1986 |
| JP | 53-133429 | 11/1978 |
| JP | 54-23570 B2 | 8/1979 |
| JP | 55-73045 A | 6/1980 |
| JP | 56-30850 B2 | 7/1981 |
| JP | 57-37349 A | 3/1982 |
| JP | 58-114031 A | 7/1983 |
| JP | 60-205444 A | 10/1985 |
| JP | 61-205933 A | 9/1986 |
| JP | 62-124556 A | 6/1987 |
| JP | 62-215947 A | 9/1987 |
| JP | 4-182650 A | 6/1992 |
| JP | 6-43650 A | 2/1994 |
| JP | 52-80022 | 7/1997 |
| JP | 11-095435 A * | 4/1999 |
| JP | 11-95435 A | 4/1999 |
| JP | 2001-281863 A | 10/2001 |
| JP | 2001-312060 A | 11/2001 |
| JP | 2002-6503 A | 1/2002 |
| JP | 2002-229190 A | 8/2002 |
| JP | 2003-207017 A | 7/2003 |

OTHER PUBLICATIONS

English Machine translation of JAPAN 11-095435.*
English Language abstract of JP 4-182650.
English Language abstract of 11-095435.
English Language abstract of JP 62-124556.
English Language abstract of JP 62-215947.
English Language abstract of JP 2001-281863.
English Language abstract of JP 2001-312060.
English Language Abstract of JP 11-95435 A.
English Language Abstract of JP 52-80022.
English Language Abstract of JP 54-23570 B2.
English Language Abstract of JP 61-205933 A.
English Language Abstract of JP 2002-229190 A.
English Language Abstract of JP 2002-6503 A.
English Language Abstract of JP 2003-207017 A.
English Language abstract of JP 4-182650, unknown date.
English Language abstract of 11-095435, unknown date.

(Continued)

Primary Examiner—Cynthia Hamilton
(74) Attorney, Agent, or Firm—Sangya Jain

(57) ABSTRACT

A photosensitive resin composition suitable for forming a thick film and an ultra-thick film used for forming a thick resist pattern used in the process of forming a magnetic pole on a magnetic head and a bump, which comprises (A) an alkali soluble novolak resin, (B) an alkali soluble acrylic resin, (C) an acetal compound, and (D) an acid generator. A polycondensate comprising a structural unit represented by the following general formula (I) (wherein R represents a saturated alkyl group having 1 to 20 carbon atoms, n is an integer of 1 to 10) as an acetal compound

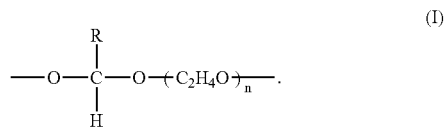

9 Claims, No Drawings

OTHER PUBLICATIONS

English Language abstract of JP 62-124556, no date given.
English Language abstract of JP 62-215947, no date given.
English Language Abstract of JP 2001-281863, no date given.
English Language Abstract of JP 2001-312060, no date given.
English Language Abstract of JP 11-95435 A, no date given.
English Language Abstract of JP 52-80022, Aug. 25, 2006.
English Language Abstract of JP 54-23570 B2, Jul. 11, 2006.
English Language Abstract of JP 61-205933 A, Jul. 11, 2006.
English Language Abstract of JP 2002-229190 A, date printed Jul. 11, 2006.
English Language Abstract of JP 2002-6503 A, date printed Jul. 12, 2006.
English Language Abstract of JP 2003-207017 A, date printed Jul. 11, 2006.

* cited by examiner

CHEMICALLY AMPLIFIED POSITIVE PHOTOSENSITIVE RESIN COMPOSITION

TECHNICAL FIELD

The present invention relates to a positive-working photosensitive resin composition, more specifically to a chemically amplified positive-working photosensitive resin composition suitable for forming a thick film and an ultra-thick film appropriately used in producing a semiconductor device, a flat panel display (FPD), a circuit board, and a magnetic head, in particular, in forming the magnetic pole of a magnetic head and the protuberance electrode called "bump" for use as a connecting terminal in a large-scale integrated circuit (LSI).

BACKGROUND ART

Conventionally, photolithographic technology has been used in forming microelements or carrying out a fine processing in a variety of fields, for example, in production of semiconductor integrated circuits such as LSIs, display screens of FDPs, circuit boards for thermal heads, and others. Positive- or negative-working photosensitive resin compositions have been used for forming resist patterns in the photolithographic technology. Among these photosensitive resin compositions, positive-working photosensitive resin compositions containing an alkali soluble resin together with a quinonediazide compound as a photosensitive agent have been used widely. Various kind of such compositions were described as "novolak resin/quinonediazide compounds" in a large number of literatures, for example, including Japanese Patent Application Publication (JP-B) Nos. 54-23570 and 56-30850 and Japanese Patent Application Laid-Open (JP-A) Nos. 55-73045 and 61-205933. Research and developments on these compositions containing a novolak resin and a quinonediazide compound have been carried out from both aspects of the novolak resins and photosensitive agents.

On the other hand, in the fields demanding a thick film processing such as magnetic head and bump, it is necessary to form a resist pattern having a high-aspect ratio and perpendicular wall. However, the conventional photoresists described above have problems, for example, of insufficient resolution or sensitivity, inability to produce desirable resist patterns, and the like, because of deterioration in light transmission of the films associated with increase in thickness; and thus there exists a need for a new photoresist that can overcome the problems.

As dry-film-system photosensitive resin compositions that can form a thick resist pattern, there have been hitherto known a photosensitive resin composition comprising a novolak resin, an acetal compound having repeating acetal units in the main chain wherein each a-carbon atom of the alcohol component of the acetal units is aliphatic, and an acid generator (JP-A No. 53-133429); a photosensitive resin composition comprising an alkali soluble resin such as novolak resin, an acetal compound, an acid generator, and additionally a particular additive such as an alkyl acrylate (JP-A No. 57-37349); and a photosensitive resin composition comprising an alkali soluble resin such as novolak resin, an acetal compound, and an acid generator (JP-A No. 58-114031). Further, as the photosensitive resin compositions comprising an acetal compound and an acid generator, known are a photosensitive resin composition comprising a novolak resin prepared using three different phenols, an acetal compound, and an acid generator (JP-A No. 62-124556); a photosensitive composition comprising a novolak resin having an acetal bond in the molecule and an acid generator (JP-A No. 62-215947); and a photoresist comprising a novolak resin, an acetal compound (chlorobenzaldehyde-diphenoxyethylacetal), and an acid generator (2-alkoxyphenyl-4,6-bis(trichloromethyl)-s-triazine) (JP-A No. 4-182650). Furthermore, there are indicated a photosensitive resin composition comprising a polymer having an acid-dissociative functional group, a polyvinyl lower alkyl ether, and an acid generator (JP-A No. 2001-281863) as the photosensitive resin composition for forming an ultra-thick film resist having a thickness of 20 μm or more that are suitable for forming a bump; and a photosensitive resin composition comprising an acid generator and an alkali soluble novolak resin of which a part of the hydrogen atoms of the phenolic hydroxyl groups are substituted with a 1,2-naphthoquinone-diazido-sulfonyl group (JP-A No. 2001-312060) as the photosensitive resin composition compatible with the thick resists having a thickness of 3 μm or more that are suitable for producing a magnetic head. However, for making the composition more compatible with an ultra-thick film, for example, having a thickness of 20 to 100 μm, there exist needs currently, for example, for improvement of the resolution thereof for production of minute rectangular patterns having a high aspect ratio, good pattern reproducibility, improvement of the heat resistance of the pattern obtained, and improvement of the throughput (yield per unit time) during production for reduction in production cost, thus demanding further improvement of the photosensitive resin composition currently.

Under the circumstances described above, an object of the present invention is to provide a chemically amplified positive-working photosensitive resin composition compatible with a thick film processing and an ultra-thick film processing that has high sensitivity and high film retention ratio (after development), excellent in coating properties, capable of forming favorable high-resolution patterns, and also excellent in the heat resistance of the patterns obtained.

Another object of the present invention is to provide a chemically amplified positive-working photosensitive resin composition for use in the electrolytic gold-, copper-, nickel- or solder-plating step of the semiconductor packaging technology.

DISCLOSURE OF THE INVENTION

As a result of intensive investigations to solve the problems, the inventors have found that the object of the present invention could be achieved by using a particular chemically amplified positive-working photosensitive resin composition comprising an alkali soluble novolak resin, an acetal compound, and a compound generating an acid by irradiating with radiation (acid generator) as that for use in the processes, for example, using a thick film having a thickness of more than 5 μm and an ultra-thick film having a thickness of more than 20 μm and completed the present invention.

Accordingly, the present invention relates to a chemically amplified positive-working photosensitive resin composition comprising (A) an alkali soluble novolak resin, (B) an alkali soluble acrylic resin, (C) and acetal compound, and (D) an acid generator.

DETAILED EXPLANATION OF THE INVENTION

Hereinafter, the present invention will be described in more detail.

The alkali soluble novolak resin (A) for use in the chemically amplified positive-working photosensitive resin composition according to the present invention is not particularly limited if it is an alkali soluble novolak resin used in hitherto publicly known photosensitive resin compositions containing an alkali soluble resin and a photosensitive agent having a quinonediazide group. The novolak resins favorably used in the present invention can be prepared by polycondensation of a single species of phenol or a mixture of the plural species of phenols with an aldehyde or aldehydes such as formalin.

Examples of the phenols constituting the novolak resins include phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylene bisphenol, methylene bis-p-cresol, resorcin, catechol, 2-methylresorcin, 4-methylresorcin, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, a-naphthol, β-naphthol, and the like; and these phenols may be used singly or as a mixture of plural species. Among these phenols, the combined use of two or more phenol compounds, for example m-cresol and p-cresol, often leads to more preferred results.

Examples of the aldehydes include paraformaldehyde, acetaldehyde, benzaldehyde, hydroxybenzaldehyde, chloroacetaldehyde, and the like as well as formalin; and these aldehydes may also be used singly or as a mixture of plural species.

The weight average molecular weight of the alkali soluble novolak resin for use in the chemically amplified positive-working photosensitive resin composition according to the present invention is preferably from 5,000 to 100,000 and more preferably from 5,000 to 50,000 as determined by polystyrene standards.

In addition, examples of the alkali soluble acrylic resins (B) used in the present invention include (B-1) alkali soluble polyacrylic esters, (B-2) alkali soluble polymethacrylic esters, and (B-3) alkali soluble poly(acrylic ester-methacrylic ester) containing at least one acrylic ester and at least one methacrylic ester as the structural units. These acrylic resins may be used alone or in combination of two or more. In the present invention, the alkali soluble acrylic resin (B) is normally used in an amount of from 2 to 200 parts, preferably from 10 to 50 parts, by weight with respect to 100 parts by weight of alkali soluble novolak resin (A).

It is preferred that the acrylic resin contains as the monomer component an organic acid monomer or an acrylic or methacrylic esters having a hydroxy group on its side chain as the copolymerization component to make itself alkali soluble, but the copolymer components providing the resin with alkali solubility are not limited to an organic acid monomer or an acrylic or methacrylic ester having a hydroxy group on the side chain.

Examples of the monomer components constituting these alkali soluble polyacrylic esters, polymethacrylic acid esters, and poly(acrylic ester-methacrylic ester) include acrylic esters, methacrylic esters, organic acid monomers and other copolymerizable monomers. Among these monomer components constituting these polymers, favorable examples of the acrylic esters, methacrylic esters, and organic acid monomers include the followings:

Acrylic esters: methyl acrylate, ethyl acrylate, n-propyl acrylate, n-butyl acrylate, n-hexyl acrylate, isopropyl acrylate, isobutyl acrylate, t-butyl acrylate, cyclohexyl acrylate, benzyl acrylate, 2-chloroethyl acrylate, methyl a-chloroacrylate, phenyl a-bromoacrylate, etc.

Methacrylic esters: methyl methacrylate, ethyl methacrylate, n-propyl methacrylate, n-butyl methacrylate, n-hexyl methacrylate, isopropyl methacrylate, isobutyl methacrylate, t-butyl methacrylate, cyclohexyl methacrylate, benzyl methacrylate, phenyl methacrylate, 1-phenylethyl methacrylate, 2-phenylethyl methacrylate, furfuryl methacrylate, diphenylmethyl methacrylate, pentachlorophenyl methacrylate, naphthyl methacrylate, isoboronyl methacrylate, benzyl methacrylate, hydroxyethyl methacrylate, hydroxy propyl methacrylate, etc.

Organic acid monomers: monocarboxylic acids such as acrylic acid, methacrylic acid, and crotonic acid; dicarboxylic acids such as itaconic acid, maleic acid, fumaric acid, citraconic acid, and mesaconic acid, and the anhydrides of these dicarboxylic acids; 2-acryloyl hydrogen phthalate, 2-acryloyloxypropyl hydrogen phthalate, etc.

Examples of other copolymerizable monomers include maleic diesters, fumaric diesters, styrene and styrene derivatives such as 4-fluorostyrene, 2,5-difluorostyrene, 2,4-difluorostyrene, p-isopropylstyrene, o-chlorostyrene, 4-acetylstyrene, 4-benzoylstyrene, 4-bromostyrene, 4-butoxycarbonylstyrene, 4-butoxymethylstyrene, 4-butylstyrene, 4-ethylstyrene, 4-hexylstyrene, 4-methoxystyrene, 4-methylstyrene, 2,4-dimethylstyrene, 2,5-dimethylstyrene, 2,4,5-trimethylstyrene, 4-phenylstyrene, and 4-propoxystyrene, acrylonitrile, (meta)acrylamide, vinyl acetate, vinyl chloride, and vinylidene chloride. Styrenes and styrene derivatives are preferable as the other copolymerizable monomer. These other copolymerizable monomers may be used as needed in an amount in the range that the resulting acrylic resin achieves the object of the invention.

Preferred examples of the alkali soluble acrylic resin for use in the chemically amplified positive-working photosensitive resin composition according to the present invention include a copolymer containing a structural unit derived from (meth)acrylic acid and/or a structural unit derived from hydroxyalkyl methacrylate and a structural unit derived from alkyl methacrylate, as well as a structural unit derived from styrene as needed; more preferably a copolymer containing a structural unit derived from (meth)acrylic acid or hydroxyethyl methacrylate, a structural unit derived from methyl methacrylate, and a structural unit derived from n-butyl acrylate, as well as a structural unit derived from styrene as needed. Preferable range of the weight-average molecular weight of the acrylic resin as determined by polystyrene standards according to the present invention is from 2,000 to 200,000 and more preferably from 20,000 to 100,000.

The acetal compound (C) for use in the chemically amplified positive-working photosensitive resin composition according to the present invention is not particularly limited if it is one of acetal compounds including those described in the aforementioned patent documents illustrated as prior art literatures or others, but preferably an acetal compound having the structural unit represented by the following general formula (I) in the molecule. The acetal compound having the structural unit represented by general formula (I) in the molecule preferably has a weight-average molecular weight in the range of 100 to 100,000 and more preferably 200 to 5,000 as determined by polystyrene standards.

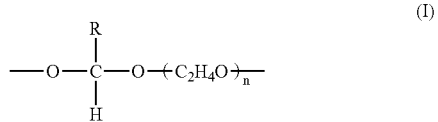

In the formula (I) above, R represents an alkyl group having 1 to 20 carbon atoms, preferably a saturated alkyl group having 3 to 10 carbon atoms. Typical examples of more preferable alkyl groups include an isopropyl group, a tert-butyl group, a 1-methylpropyl group, and a 1-ethylpropyl group. In addition, n is an integer of 1 to 10, preferably 2 to 4.

Typical examples of the acetal compounds represented by general formula (I) above are polycondensates having the repeating units represented by general formula (I) above that are prepared by reacting an aldehyde: RCHO, a dialcohol: $RCH(OH)_2$, or an acetal: $RCH(OR^1)_2$ (in the formula, R represents a group defined above and $R^1$ represents an alkyl group) with ethylene glycol or polyethylene glycol represented by formula:

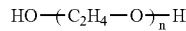

wherein n is the integer defined above.

In the present invention, the acetal compound (C) is normally used in an amount of from 5 to 50 parts by weight, preferably from 20 to 30 parts by weight, with respect to 100 parts by weight of the alkali soluble novolak resin (A).

The acid generator (D) for use in the chemically amplified positive-working photosensitive resin composition according to the present invention, i.e., the compound that generates an acid by irradiating with a radiation, is not particularly limited if it generates an acid by irradiating with a radiation.

Typical examples of these acid generators include compounds used as an acid generator in conventional chemically amplified resists. Such acid generators include onium salts such as iodonium salts, sulfonium salts, diazonium salts, ammonium salts, and pyridinium salts; halogen-containing compounds such as haloalkyl group-containing hydrocarbon compounds and haloalkyl group-containing heterocyclic compounds (halomethyltriazine derivatives, etc.); diazo ketone compounds such as 1,3-diketo-2-diazo compounds, diazobenzoquinone compounds, and diazonaphthoquinone compounds; sulfone compounds such as β-ketosulfone and β-sulfonylsulfone; sufonic acid compounds such as alkylsulfonic esters, haloalkylsulfonic esters, arylsulfonic esters, and iminosulfonates; and naphthalimide compounds such as N-(trifluoromethylsulfonyloxy)-1,8-naphthalimide, N-(p-toluenesulfonyloxy)-1,8-naphthalimide, N-(methylsulfonyloxy)-1,8-naphthalimide, and N-(camphorsulfonyloxy)-1,8-naphthalimide. These compounds may be used singly or as a mixture of two or more. The acid generator (D) is normally used in an amount of from 0.05 to 10 parts by weight, preferably from 0.5 to 3.0 parts by weight with respect to 100 parts by weight of the alkali soluble novolak resin in the present invention.

Particularly preferable examples of the acid generators for use in the present invention include triazine-based acid generators represented by 2-[2-(5-methylfuran-2-yl)ethenyl]-4,6-bis-(trichloromethyl)-s-triazine, cyano-based acid generators represented by 5-methylsulfonyloxyimino-5H-thiophen-2-ylidene-2-methylphenylacetonitrile, and imide-based acid generators represented by N-(trifluoromethylsulfonyloxy)-1,8-naphthalimide.

Examples of the solvents for use in dissolving the alkali soluble novolak resin, alkali soluble acrylic resin, acetal compound, and acid generator according to the present invention include ethylene glycol monoalkylethers such as ethylene glycol monomethylether and ethylene glycol monoethylether; ethylene glycol monoalkylether acetates such as ethylene glycol monomethylether acetate and ethylene glycol monoethylether acetate; propylene glycol monoalkylethers such as propylene glycol monomethylether and propylene glycol monoethylether; propylene glycol monoalkylether acetates such as propylene glycol monomethylether acetate and propylene glycol monoethylether acetate; lactic acid esters such as methyl lactate and ethyl lactate; aromatic hydrocarbons such as toluene and xylene; ketones such as methylethylketone, 2-heptanone, and cyclohaxanone; amides such as N,N-dimethylacetamide and N-methylpyrrolidone; and lactones such as γ-butylolactone. These solvents may be used singly or as a mixture of two or more solvents.

The photosensitive resin composition according to the present invention may further contain, as needed, other additives such as dyes, adhesive aids and surfactants. Examples of the dyes include Methyl Violet, Crystal Violet, and Malachite Green. Examples of the adhesive aids include alkylimidazolines, butyric acid, alkyl acids, polyhydroxystyrene, polyvinylmethylether, t-butylnovolak, epoxysilane, epoxy polymers, and silane. Examples of the surfactants include nonionic surfactants including polyglycols and the derivatives thereof such as polypropylene glycol, polyoxyethylene lauryl ether, fluorine-containing surfactants such as Fluorad (trade name, manufactured by Sumitomo 3M Co., Ltd.), Magafac (trade name, manufactured by Dainippon Ink and Chemicals, Inc.), Surflon (trade name, manufactured by Asahi Glass Company, Ltd.), and organosiloxane surfactants such as KP341 (trade name, manufactured by Shin-Etsu Chemical Co., Ltd.).

Incidentally, bonding methods in the semiconductor packaging technology include wire bonding method of connecting a chip to external circuits by using wires, TAB (Tape Automated Bonding) method of connecting a chip to external circuits by using bumps (metal protuberance), and FC (Flip Chip) method. The bump-forming technique is used both in the TAB and FC methods, and the bumps are formed on the electrodes of the chip or the electrodes on the substrate. These bumps are formed usually according to the following procedure. That is, first a barrier metal foil as an electrically conductive layer is laminated on a silicon wafer carrying LSI elements and then a photosensitive resin composition, so called resist is applied thereon to form a photoresist film. Next the photoresist film is exposed to light through a mask in such a manner that bump-forming areas become uncovered and developed to form a pattern. An electrode material such as gold or copper is then deposited thereon by electrolytic plating by using the pattern as a template. After removal of the resist film remaining thereon, the barrier metal is removed by etching. The wafer is then cut into square chips, which are supplied to the step, for example, of the packaging by TAB or packaging by flip chip.

As described above, a patterned resist is produced by using a photosensitive resin composition before the bump formation, the chemically amplified positive-working photosensitive resin composition according to the present invention is favorably used as a resist in the bump-forming processes, for example, in the cyan or non-cyan electrolytic gold plating steps in gold bump-forming process. Accordingly, the present invention relates to a chemically amplified positive-working photosensitive resin composition used in the cyan or non-cyan electrolytic gold plating steps in the gold bump-forming processes of the semiconductor packaging technology.

In addition, in production of LSI elements, FDPs such as LCD (liquid crystal display) and circuit boards, not only bumps but also wiring and others are formed by plating. In electrolytic plating for bumps and wiring, other metals such as copper, nickel, and solder are also used as plating materials as well as gold. The chemically amplified positive-working photosensitive resin composition according to the present invention can also be used preferably as a resist for use in the step of plating with copper, nickel, solder, or the like in the bump-forming and wiring-forming plating steps. Accordingly, the present invention also relates to a chemically amplified positive-working photosensitive resin composition that is used in copper-, nickel-, or solder-plating steps.

Further, not only a formation of a single plating layer, but also continuous formations of multiple plating layers by use of the same resist pattern have been widely conducted. The chemically amplified positive-working photosensitive resin composition according to the present invention is also characterized by being used in plating processes wherein the electrolytic gold plating and copper-, nickel-, or solder-plating are carried out in continuous multilayer plating steps. The order of the gold-plating step and the copper-, nickel-, or solder-plating step during multilayer plating is arbitrary.

The chemically amplified positive-working photosensitive resin composition according to the present invention can also be used favorably as a plating resist during production of magnetic heads or the like.

As described above, the chemically amplified positive-working photosensitive resin composition according to the present invention is first applied onto a base material such as a support plate having as needed an electrically conductive layer formed thereon made of a conductive material such as aluminium, copper, silver, gold, palladium, or an alloy of two or more of these metals; and the resulting resin layer is then prebaked and converted, for example, into a thick or ultra-thick photoresist layer. The base materials include, in addition to the silicone substrate described above, substrates of titanium nitride (TiN), nickel, and permalloy (alloy of iron, nickel, and others); and substrates of soda-lime glass, quartz glass, silicon carbide, titanium carbide, zirconium carbide, boron nitride, aluminium nitride, silicon nitride, silicone, germanium, gallium-arsenic, and gallium-phosphorus. The photoresist layer is then pattern-exposed to light through a mask, developed with an alkaline developing solution, and then subjected as needed to rinsing, post-exposure baking (PEB), or the like. A thick or ultra-thick positive-working resist pattern higher in resolution and favorable in shape is formed in this manner, and is used especially favorably as a thick or ultra-thick plating resist used in forming magnetic poles on magnetic heads, bumps, and others. The chemically amplified positive-working photosensitive resin composition according to the present invention can positively be used in the fields wherein conventional positive-working photosensitive resin compositions have been used, for example, as a plating resist for circuit boards and others. In addition, the positive-working photosensitive resin composition according to the present invention has many advantages including high sensitivity, higher film retention ratio after development, and no scum generation.

Any one of the methods used conventionally in applying photosensitive resin compositions such as spin coating method, roll coating method, land coating method, spray coating method, flow and spread coating method, and dip coating method may be used for forming the coating film of the photosensitive resin composition according to the present invention.

Alternatively, the coating film may be formed if needed, for example, by screen-printing. Examples of the radiation used in exposure include ultraviolet rays such as g-line and i-line, far ultraviolet rays such as KrF and ArF excimer lasers, X-rays, and electron beams. In addition, any one of the methods used conventionally in developing photoresists such as paddle developing method, dip developing method, and vibratory dip developing method may be used for developing the photosensitive resin composition according to the present invention. Examples of the developers include inorganic alkali compounds such as sodium hydroxide, potassium hydroxide, sodium carbonate, and sodium silicate; ammonia; organic amines such as ethylamine, propylamine, diethyl amine, diethylaminoethanol, and triethylamine; and quaternary amines such as tetramethylammonium hydroxide.

The optimal processing conditions including light-exposure condition for processing the chemically amplified positive-working photosensitive resin composition according to the present invention may vary according to the thickness of photoresist, exposure light source, developer used, and others. But, when an ultra-thick film photoresist having a thickness of 20 μm or more is exposed to light for example by using an HBO1000W/D mercury lamp manufactured by Mitsubishi Electric Osram Ltd., which is used in Examples described below as an exposure light source, the exposure intensity is usually approximately 100 to 500 $mJ/cm^2 \cdot sec$; and the developing time is approximately 60 to 900 seconds when a common aqueous organic or inorganic alkaline solution is used as the developer and the film is developed by the dip or paddle developing method.

In addition, the chemically amplified positive-working photosensitive resin composition according to the present invention may also be used as a so-called dry film, which is prepared by applying a photosensitive resin composition not directly on the substrate but on a removable plastic film, baking the resulting coated layer to form a photoresist film once on the temporary supporting plate of plastics film, and which is used as adhered to a substrate to be processed such as a supporting plate. Any one of conventional plating solutions and plating methods may be used as those used in the plating steps.

BEST MODE FOR CARRYING OUT THE INVENTION

Hereinafter, the present invention will be described in more detail with reference to Examples, but it should be understood that the present invention is not restricted by these Examples. In the following Examples, weight-average molecular weights are values as determined by styrene standards.

EXAMPLE 1

One hundred parts by weight of a novolak resin having a weight-average molecular weight of 7,000 (m-cresol: 40%, p-cresol: 60%), 15 parts by weight of a ternary copolymer of methacrylic acid, methyl methacrylate, and n-butyl acrylate (molar ratio: 20/50/30) having a weight-average molecular weight of 30,000, 30 parts by weight of a polymer having a weight-average molecular weight of 1,000 prepared by polycondensation of triethylene glycol and 2-ethylbutane-1,1-diol, and 0.6 part by weight of 2-[2-(5-methylfuran-2-yl)-ethenyl]-4,6-bis-(tri-chloromethyl)-s-triazine as an acid generator were dissolved in 200 parts by weight of propylene glycol monomethylether acetate. The solution was stirred and then filtered through a 1.2-µm filter to give a photosensitive resin composition according to the present invention. The composition was spin coated onto a 6-inch silicon wafer and baked at 120° C. for 5 minutes on a hot plate to give a resist film having a thickness of 25 µm. The resist film was exposed to light through a test pattern containing hole patterns having a variety of line widths (hole diameters: from 5 to 50 µm; wall widths: from 5 to 50 µm) for 10 seconds (250 mJ/cm$^2$) by using an HBO1000W/D mercury lamp manufactured by Mitsubishi Electric Osram Ltd. in an exposure machine, MA-200/ML manufactured by Suss MicroTec K.K. and developed with a solution of AZ 303N manufactured by Clariant Japan K.K. 9 times diluted with distilled water at 23° C. for 480 seconds to give a good resist pattern. In addition, the illuminance of the HBO1000W/D mercury lamp at 405 nm is 25 mJ/cm$^2$·sec and AZ 303N is a 4.8 wt % aqueous KOH solution. The shape of the resist pattern was determined by observing a hole resist pattern having a hole diameter and a wall width respectively of 20 µm and 20 µm.

EXAMPLE 2

The same procedure as in Example 1 was carried out except for using 5-methylsulfonyloxyimino-5H-thiophen-2-ylidene-2-methylphenylacetonitrile as the acid generator instead of the triazine-based acid generator, and results in Table 1 were obtained.

EXAMPLE 3

The same procedure as in Example 1 was carried out except for using a quaternary copolymer of methacrylic acid, methyl methacrylate, n-butyl acrylate, and styrene (molar ratio: 20/50/15/15) having a weight-average molecular weight of 30,000 instead of the ternary copolymer of methacrylic acid, methyl methacrylate, and n-butyl acrylate, and results in Table 1 were obtained.

EXAMPLE 4

The same procedure as in Example 1 was carried out except for using a ternary copolymer of hydroxyethyl methacrylate, methyl methacrylate, and n-butyl acrylate (molar ratio: 20/50/30) having a weight-average molecular weight of 30,000 instead of the ternary copolymer of methacrylic acid, methyl methacrylate, and n-butyl acrylate, and results in Table 1 were obtained.

EXAMPLE 5

The same procedure as in Example 4 was carried out except for using 15 parts by weight of the ternary copolymer (molar ratio: ditto) having a weight-average molecular weight of 80,000 as the ternary copolymer of hydroxyethyl methacrylate, methyl methacrylate, and n-butyl acrylate, and results in Table 1 were obtained.

COMPARATIVE EXAMPLE 1

The same procedure as in Example 1 was carried out except for using a photosensitive resin composition prepared by dissolving 100 parts by weight of a novolak resin having a weight-average molecular weight of 7,000 (same as that in Example 1) and 10 parts by weight of 1,2-naphthoquinone-(2)-diazide-4-sulfonate of 2,3,4-tri-hydroxy-4-benzophenone in 200 parts by weight of propylene glycol monomethylether acetate, and results in Table 1 were obtained.

COMPARATIVE EXAMPLE 2

The same procedure as in Comparative Example 1 was carried out except for exposing for 40 seconds instead of for 10 seconds, and results in Table 1 were obtained.

COMPARATIVE EXAMPLE 3

The same procedure as in Comparative Example 2 was carried out except for using a solution of AZ303N 5 times diluted with distilled water as the developing solution instead of that 9 times diluted, and results in Table 1 were obtained.

TABLE 1

| | Film retention ratio (%) | Film thickness (µm) | Pattern shape | Description |
| --- | --- | --- | --- | --- |
| Example 1 | >98 | 25 | Good | Rectangular |
| Example 2 | >98 | 25 | Good | Rectangular |
| Example 3 | >98 | 25 | Good | Rectangular |
| Example 4 | >98 | 25 | Good | Rectangular |
| Example 5 | >98 | 25 | Good | Rectangular |
| Comparative Example 1 | >98 | 25 | No resolution | |
| Comparative Example 2 | >98 | 25 | No resolution | |
| Comparative Example 3 | >95 | 25 | Unfavorable | Mortar-shaped |

EXAMPLE 6

The same procedure as in Example 1 was carried out except for giving a resist film of 100 µm in thickness prepared by baking at 130° C. for 5 minutes on a hot plate instead of the resist film of 25 µm in thickness prepared by baking at 120° C. for 5 minutes on a hot plate, and results in Table 2 were obtained.

EXAMPLE 7

The same procedure as in Example 6 was carried out except for using 5-methylsulfonyloxyimino-5H-thiophen-2-ylidene-2-methylphenyl acetonitrile as the acid generator instead of 2-[2-(5-methylfuran-2-yl)ethenyl]-4,6-bis-(trichloro-methyl)-s-triazine, and results in Table 2 were obtained.

COMPARATIVE EXAMPLE 4

The same procedure as in Example 6 was carried out except for using a photosensitive resin composition prepared by dissolving 100 parts by weight of a novolak resin having a weight-average molecular weight of 7,000 (same as that in Example 6) and 10 parts by weight of 1,2-naphthoquinone-(2)-diazide-4-sulfonate of 2,3,4-trihydroxy-4-benzophenone in 200 parts by weight of propylene glycol monomethylether acetate, and results in Table 2 were obtained.

TABLE 2

| | Film retention ratio (%) | Film thickness (μm) | Pattern shape | Description |
|---|---|---|---|---|
| Example 6 | >98 | 100 | Good | Rectangular (Slightly barrel-shaped) |
| Example 7 | >98 | 100 | Good | Rectangular (Slightly barrel-shaped) |
| Comparative Example 4 | >95 | 100 | No resolution | |

EXAMPLE 8

One hundred parts by weight of a novolak resin having a weight-average molecular weight of 7,000 (m-cresol: 40%, p-cresol: 60%), 15 parts by weight of a ternary copolymer of hydroxyethyl methacrylate, methyl methacrylate, and n-butyl acrylate (molar ratio: 20/50/30) having a weight-average molecular weight of 32,000, 24 parts by weight of a polymer having a weight-average molecular weight of 1,000 prepared by polycondensation of triethylene glycol and 2-ethylbutane-1,1-diol, and 0.4 part by weight of N-(trifluoromethylsulfonyloxy)-1,8-naphthalimide as an acid generator were dissolved in 200 parts by weight of propylene glycol monomethylether acetate. The solution was stirred and then filtered through a 1.2-μm filter to give a photosensitive resin composition according to the present invention. The composition was spin coated onto a 6-inch silicon wafer having titanium and gold layers respectively having thicknesses of 500 and 2,000 angstroms and baked at 120° C. for 5 minutes on a hot plate to give a resist film of 25 μm in thickness. The resulting resist film was exposed to light through a test pattern containing hole patterns having a variety of line widths (hole diameters: from 5 to 50 μm; wall widths: from 5 to 50 μm) for 10 seconds (250 mJ/cm²) by using the HBO1000W/D mercury lamp manufactured by Mitsubishi Electric Osram Ltd. in the exposure machine, MA-200/ML manufactured by Suss MicroTec K.K. and developed with a solution of AZ 303N manufactured by Clariant (Japan) K.K. 7-times diluted with distilled water at 23° C. for 210 seconds to give a good resist pattern. In addition, the illuminance of the HBO1000W/D mercury lamp at 405 nm is 25 mJ/cm²·sec. The shape of the resist pattern was determined by observing the shape of a hole resist pattern having a hole diameter and a wall width respectively of 20 μm and 20 μm. The wafer thus obtained was electroplated at 42° C. for 60 minutes under the condition of a current of 0.4 A/dm² by using a TEMPER EX401 gold plating solution manufactured by Electroplating Engineers of Japan Ltd. After plating, the resulting resist pattern was separated by processing with AZ Remover 700 manufactured by Clariant (Japan) K.K. at 23° C. for 180 seconds to give a good gold-plated pattern. Plating shape was determined by observing a plating shape of a hole pattern having a hole diameter and a wall width respectively of 20 μm and 20 μm, and results in Table 3 were obtained.

EXAMPLE 9

The same procedure as in Example 8 was carried out except for using 2-[2-(5-methylfuran-2-yl)ethenyl]-4,6-bis-(tri-chloroethyl)-s-triazine instead of N-(trifluoromethylsulfonyloxy)-1,8-naphthalimide used as the acid generator in Example 8, and results in Table 3 were obtained.

EXAMPLE 10

The same procedure as in Example 8 was carried out except for using 5-methylsulfonyloxyimino-5H-thiophen-2-ylidene-methylphenyl acetonitrile instead of N-(trifluoromethyl-sulfonyloxy)-1,8-naphthalimide used as the acid generator in Example 8, and results in Table 3 were obtained.

EXAMPLE 11

The same procedure as in Example 8 was carried out except for using a quaternary copolymer of hydroxyethyl methacrylate, methyl methacrylate, n-butyl acrylate, and styrene (molar ratio: 20/50/15/15) having a weight-average molecular weight of 30,000 instead of the ternary copolymer of hydroxy methacrylate, methyl methacrylate, and n-butyl acrylate, and results in Table 3 were obtained.

EXAMPLE 12

The same procedure as in Example 8 was carried out except for using a MICROFAB Au660 gold plating solution manufactured by Electroplating Engineers of Japan Ltd. at 60° C. for 40 minutes under the condition of a current of 0.8 A/dm² instead of using a TEMPER EX401 gold plating solution manufactured by Electroplating Engineers of Japan Ltd. at 42° C. for 60 minutes under the condition of a current of 0.4 A/dm², and results in Table 3 were obtained.

COMPARATIVE EXAMPLE 6

The same procedure as in Example 8 was carried out except for using a photosensitive resin composition prepared by dissolving 100 parts by weight of a novolak resin having a weight-average molecular weight of 7,000 (same as that in Example 8) and 10 parts by weight of 1,2-naphthoquinone-(2)-diazide-4-sulfonate of 2,3,4-trihydroxy-4-benzophenone in 200 parts by weight of propylene glycol monomethylether acetate, and results in Table 3 were obtained.

COMPARATIVE EXAMPLE 7

The same procedure as in Comparative Example 6 was carried out except for exposing to light through the test pattern for 40 seconds instead of 10 seconds in the exposure machine, MA-200/ML manufactured by Suss MicroTec K.K., and results in Table 3 were obtained.

COMPARATIVE EXAMPLE 8

The same procedure as in Comparative Example 7 was carried out except for using the solution of AZ 303N manufactured by Clariant (Japan) K.K. 8-times diluted with distilled water instead of that 5-times diluted with distilled water, and results in Table 3 were obtained.

TABLE 3

| | Film retention ratio (%) | Sensitivity | Pattern shape | Plating shape | Crack, smudge, and others * | Description |
|---|---|---|---|---|---|---|
| Example 8 | >98 | 250 mJ/cm$^2$ | Good | Good | Naught | Rectangular |
| Example 9 | >98 | 250 mJ/cm$^2$ | Good | Good | Naught | Rectangular |
| Example 10 | >98 | 250 mJ/cm$^2$ | Good | Good | Naught | Rectangular |
| Example 11 | >98 | 250 mJ/cm$^2$ | Good | Good | Naught | Rectangular |
| Example 12 | >98 | 250 mJ/cm$^2$ | Good | Good | Naught | Rectangular |
| Comparative Example 6 | >98 | No opening | No opening | — | | |
| Comparative Example 7 | >98 | No opening | No opening | — | | |
| Comparative Example 8 | >95 | 1,000 mJ/cm$^2$ | Good | Barrel-shaped | Naught | Mortar-shaped |

* Presence of cracks, smudges, and others was examined by observing the sectional form using the scanning electron microscope (SEM).

EXAMPLE 13

The same procedure as in Example 1 was carried out except for giving a resist film of 65 μm in thickness prepared by baking at 130° C. for 5 minutes on a hot plate instead of giving the resist film of 25 μm in thickness prepared by baking at 120° C. for 5 minutes on a hot plate, and results in Table 4 were obtained.

EXAMPLE 14

The same procedure as in Example 13 was carried out except for using 2-[2-(5-methylfuran-2-yl)ethenyl]-4,6-bis-(tri-chloroethyl)-s-triazine as the acid generator instead of N-(trifluoromethylsulfonyloxy)-1,8-naphthalimide, and results in Table 4 were obtained.

COMPARATIVE EXAMPLE 9

The same procedure as in Example 13 was carried out except for using a photosensitive resin composition prepared by dissolving 100 parts by weight of a novolak resin having a weight-average molecular weight of 7,000 and 10 parts by weight of 1,2-naphthoquinone-(2)-diazide-4-sulfonate of 2,3,4-trihydroxy-4-benzophenone in propylene glycol monomethylether acetate, and the result in Table 4 was obtained.

TABLE 4

| | Film retention ratio (%) | Sensitivity | Pattern shape | Description |
|---|---|---|---|---|
| Example 13 | >98 | 250 mJ/cm$^2$ | Good | Rectangular |
| Example 14 | >98 | 250 mJ/cm$^2$ | Good | Rectangular (Slightly barrel-shaped) |
| Comparative Example 9 | >95 | No opening | No Opening | |

The resulting resist patterns for preparing thick film patterns and for preparing gold bumps both obtained in Examples according to the present invention had no scum and showed good shape of resist pattern. It is apparent from the Tables that the every chemically amplified positive-working photosensitive resin composition according to the present invention is excellent in film retention ratio and sensitivity.

Further the results in Table 1 indicate that use of an acid generator (PAG) is effective in producing a photosensitive resin composition having higher-sensitivity and higher-resolution than the photosensitive resin composition produced by the use of the photosensitive agent hitherto commonly used, 1,2-naphthoquinone-(2)-diazide-4-sulfonate of 2,3,4-trihydroxy-4-benzophenone. It seems to be because, in contrast to the conventional photosensitive agent, which absorbs the light of exposure wavelength and thus practically loses its photosensitivity in the deeper layer of a thick film due to absorption at the upper layer, the chemical amplification system in which a PAG is used demands a small amount of light-absorbing acid generator and thus allows patterning even in lithography employing thick films and consequently production of resist patterns good in shape. In addition, the results in Table 2 indicate that it is extremely difficult to perform patterning by using a composition containing a PAG when a thicker film of 100 μm or more in thickness is exposed and developed. It seems to be because the PAG absorbs the light of exposure wavelength and the exposed light becomes more inactivated at the bottom layer closer to the substrate, resulting in suppression of the reaction of the photosensitive agent and inhibition of the film becoming more alkali soluble. The phenomenon can be observed in films having a thickness of more than 40 μm.

EVALUATION OF HEAT RESISTANCE

The heat resistance of the resist patterns obtained by the chemically amplified positive-working photosensitive resin compositions according to the present invention was further evaluated for heat resistance.

EXAMPLE 15

The resist pattern obtained in Example 1 was heat-treated at 90° C. for one minute on a hot plate, and the shapes of the resist pattern before and after heat-treatment were compared. The patterns were both rectangular and not particularly different from each other.

COMPARATIVE EXAMPLE 10

The same procedure as in Example 1 was carried out except for preparing a photosensitive resin composition not using the ternary copolymer of methacrylic acid, methyl methacrylate, and n-butyl acrylate having a weight-average molecular weight of 30,000 to give a resist pattern. The film retention ratio of the resulting resist pattern was 98% or more, and the pattern shape was rectangular and good. The resist pattern thus obtained was heat-treated in the same manner as in Example 15, resulting in a drooping of the pattern.

The results in Example 15 and Comparative Example 10 indicate that the photosensitive resin composition according to the present invention is excellent in heat resistance.

ADVANTAGEOUS EFFECT OF THE INVENTION

As described above, the present invention practically allows production of resist patterns excellent both in resolution and sensitivity having a thickness of 5 μm or more for a thick film or an ultra-thick film for forming a gold-bump, and provides a chemically amplified positive-working photosensitive resin composition that is excellent in coating property, heat resistance and uniformity in the line width of resist pattern and allows production of good patterns.

The invention claimed is:

1. A chemically amplified positive-working photosensitive resin composition, comprising (A) an alkali soluble novolak resin, (B) an alkali soluble acrylic resin, (C) an acetal compound, and (D) an acid generator further where the weight ratio of the components (A):(B):(C):(D) is 100:(2 to 200):(1 to 50):(0.05 to 10), further where the acrylic resin contains a structural unit derived from hydroxyalkyl methacrylate and a structural unit derived from alkyl methacrylate, and optionally a structural unit derived from styrene.

2. The chemically amplified positive-working photosensitive resin composition according to claim 1, wherein the acetal compound has a structural unit represented by the following general formula (I):

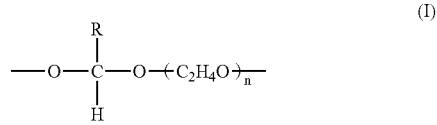

wherein R represents a saturated alkyl group having 1 to 20 carbon-atoms; and n is an integer of 1 to 10.

3. A coated substrate comprising a coating of the chemically amplified positive-working photosensitive resin composition of claim 1, wherein the coating has a film thickness of 5 μm or more.

4. A process comprising imaging the chemically amplified positive-working photosensitive resin composition of claim 1 and followed by forming a cyan or non cyan electrolytic gold plating layer.

5. The process of claim 4 wherein plating layer is a multilayer.

6. The process of claim 5, where the multilayer comprises a gold layer and at least one additional layer selected from copper, nickel and solder.

7. A process comprising imaging the chemically amplified positive-working photosensitive resin composition of claim 1 and followed by forming a plating layer selected from copper, nickel and solder.

8. The process of claim 7, wherein the plating layer is a multilayer.

9. The process of claim 8, where the multilayer comprises at least one layer selected from copper, nickel and solder, and at least one additional layer comprising gold.

* * * * *